United States Patent [19]
Wong et al.

[11] Patent Number: 4,888,738
[45] Date of Patent: Dec. 19, 1989

[54] CURRENT-REGULATED, VOLTAGE-REGULATED ERASE CIRCUIT FOR EEPROM MEMORY

[75] Inventors: Ting-Wah Wong, San Jose; Raul-Adrian Cernea, Walnut Creek, both of Calif.

[73] Assignee: Seeq Technology, San Jose, Calif.

[21] Appl. No.: 212,974

[22] Filed: Jun. 29, 1988

[51] Int. Cl.$^4$ .......................... G11C 7/00; G05F 3/16
[52] U.S. Cl. .................................... 365/218; 365/185; 365/189.11; 365/189.06; 365/230.06; 323/311; 323/316
[58] Field of Search ............... 365/185, 104, 218, 189, 365/230, 233, 189.06, 189.11, 230.06; 323/311, 312, 315, 316, 317

[56] References Cited

U.S. PATENT DOCUMENTS

| | | | |
|---|---|---|---|
| 4,393,481 | 7/1983 | Owen et al. | 365/185 |
| 4,405,868 | 9/1983 | Lockwood | 365/226 |
| 4,733,371 | 3/1988 | Terada et al. | 365/226 |
| 4,785,423 | 11/1988 | Skupnjak et al. | 365/185 |
| 4,797,856 | 1/1989 | Lee et al. | 365/218 |

*Primary Examiner*—Glenn A. Gossage
*Attorney, Agent, or Firm*—Lyon & Lyon

[57] ABSTRACT

A control circuit for erasing EEPROM memory cells is disclosed, including a charge pump having two switched constant current sources driven by opposing clocks. Current produced by the current sources is coupled to a node from where it is used to erase EEPROM memory cells. A switch is provided to isolate the device being erased by floating its source.

6 Claims, 1 Drawing Sheet

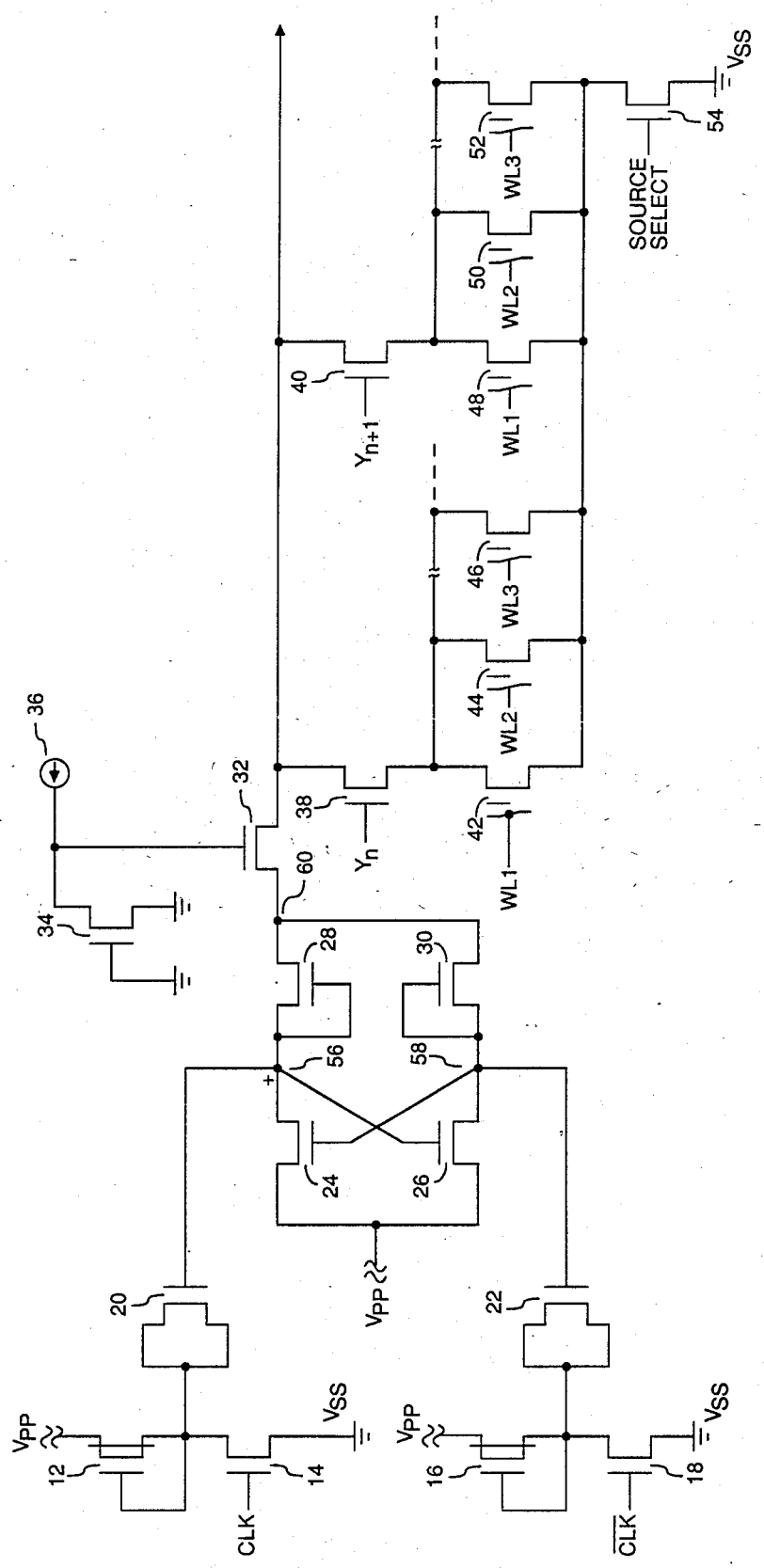

CURRENT-REGULATED, VOLTAGE-REGULATED ERASE CIRCUIT FOR EEPROM MEMORY

BACKGROUND OF THE INVENTION

1. Field Of The Invention

The present invention relates to circuitry for use in memory integrated circuits. More particularly, the present invention relates to control circuitry for erasing EEPROM memory cells.

2. The Prior Art

In known memory circuits, a voltage is utilized to erase the memory cells of an EEPROM. A circuit is disposed on the integrated circuit chip containing the memory to generate this voltage. It is, however, difficult to current-regulate a voltage source used for erasing and programming EEPROM cells.

BRIEF DESCRIPTION OF THE INVENTION

The present invention is a control circuit for erasing EEPROM cells. More particularly, the present invention includes a charge pump for supplying current driven by controlled current sources and followed by a voltage clamp. The source diffusions of the memory cells with which the control circuit of the present invention may be used are connected to Vss via a switch which is turned off during erasing. The use of this current pump circuit allows more controlled erasing.

BRIEF DESCRIPTION OF THE DRAWINGS

The FIGURE is a schematic diagram of a preferred embodiment of the current source circuit of the present invention, also showing the memory cells and source select switch.

DETAILED DESCRIPTION OF A PREFERRED EMBODIMENT

Referring to the FIGURE, two clock-driven current sources are driven from opposing clocks. The first current source includes depletion device 12, having its drain connected to a source of programming voltage Vpp, and its source and gate connected together to the drain of N-channel device 14. The source of N-channel device 14 is connected to a source of voltage Vss, and the gate of N-channel device 14 is connected to the CLK output of a clock circuit.

The second clock-driven current source is identical to the first, including depletion device 16 having its drain connected to Vpp, and its source and gate connected together to the drain of N-channel device 18. The source of N-channel device 18 is connected to Vss and its gate is driven by a clock signal $\overline{CLK}$, complementary to the clock signal CLK which drives the first current source.

The common connection of the source of depletion device 12 and N-channel device 14 is connected to the source/drain diffusion of a first MOS gate capacitor 20. The common connection of the source of depletion device 16 and N-channel device 18 is connected to the source/drain diffusion of a second gate capacitor 22.

The gate end of capacitors 20 and 22 are connected to a pair of cross coupled N-channel devices 24 and 26. The drains of N-channel devices 24 and 26 are both connected to Vpp. The source of N-channel transistor 24 is connected to the drain and the gate of N-channel device 28, a diode-connected transistor. The source of N-channel device 28 is connected to the source of N-channel device 30, another diode-connected transistor.

The drain and gate of N-channel device 30 are both connected to the source of N-channel device 26. The gate of N-channel device 24 is connected to the source of N-channel device 26. The gate of N-channel device 26 is connected to the source of N-channel device 24.

The output of gate capacitor 20 is connected to the source of N-channel device 24 and the output of gate capacitor 22 is connected to the source of N-channel device 26. The sources of diode-connected N-channel devices 28 and 30 are connected together to node 60 and to the drain of N-channel clamping device 32. The gate of N-channel device 32 is connected to a constant voltage, preferably about 18 volts, which may be supplied by a grounded-gate breakdown diode shown in the figure as N-channel device 34, having its gate and source connected to Vss and its drain connected to the gate of N-channel device 32 and to a current source 36. The breakdown voltage of grounded-gate breakdown device 34 may be set to about 18 volts. Those of ordinary skill in the art will recognize that other constant voltage sources could be used.

Clamping device 32 will turn off when the voltage at its source, i.e., the voltage appearing on the drains of the Y-select devices, equals the voltage on its gate minus 1 Vt. This acts to prevent over-erasing, which would increase programming times in the next cycle.

This control circuit is shown connected to two Y select devices, 38 and 40, designated as $Y_n$ and $Y_{(n+1)}$. Y-select device 38 is shown selecting three illustrative EEPROM memory cell transistors, 42, 44, and 46, shown having their gates connected respectively to word lines WL1, WL2, WL3. Y-select device 40 is shown selecting three illustrative EEPROM memory cell transistors 48, 50, and 52, shown having their gates connected respectively to word lines WL1, WL2, and WL3. The sources of memory cell transistors 42, 44, 46, 48, 50, and 52 are commonly connected to the drain of source select device 54. The source of source select device 54 is connected to Vss and its gate connected to a suitable triggering signal. The function of source select device will be explained with reference to the operation of the control circuit in the FIGURE.

Operation of the current source charge pump of the present invention is as follows. Initially, with no clock active, and CLK=0 and $\overline{CLK}$=1, the circuit will operate with a voltage of Vpp at the source/drain diffusion end of capacitor 20 and approximately zero at the source/drain diffusion end of capacitor 22. Nodes 56 and 58 are floating and could be both at ground level by leakage. There is no active current through the pump.

The complementary clocks CLK and $\overline{CLK}$, running at a frequency of from about 1 to 30 MHz, preferably about 10 MHz, drive the current sources comprising depletion device 12 and depletion device 16. After several clock cycles, when the CLK input to the gate of N-channel transistor 14 is low, depletion device 12 acts as a constant current source and charges gate capacitor 20. Since depletion device 12 acts as a constant current source, the current through gate capacitor 20 is relatively constant as it charges. This current flows into node 56, the common connection between the source of N-channel device 24 and the drain of N-channel device 28. Device 24 is turned off. Since node 56 is at a voltage no higher than a voltage threshold above node 60, current will be flowing from gate capacitor 20 into node 56 independent of the voltage at node 60. The gate of N-channel transistor 26 is connected to node 56, so this transistor turns on, allowing a voltage of Vpp, or the voltage at node 56 minus 1 Vt, whichever is lower, to appear at node 58. Since the voltage at the source of N-channel device 24 is higher than its gate voltage, it remains off. During this clock phase, capacitor 22, having its source/drain diffusion end effectively at ground through N-channel transistor 18, charges to the voltage at node 58.

The diode-connected N-channel transistor 28 is forward biased and conducts current to node 60, but diode-connected N-channel transistor 30 is reverse biased and does not conduct current.

When the clock transition occurs and the CLK input to N-channel device 14 goes high, N-channel device 14 turns on, thus pulling the drain/source diffusion end of gate capacitor 20 to ground. During this clock phase, capacitor 20, having its source/drain diffusion end effectively at ground through N-channel transistor 14, charges to the voltage at node 56, which is equal to the voltage at node 58 minus 1 Vt, or Vpp, whichever is lower.

Now, the $\overline{CLK}$ input is low, turning off N-channel device 18 and allowing the constant current source depletion device 16 to cause current to flow through gate capacitor 22 to node 58. At this point, node 56 is at a voltage approximately equal to the voltage, at node 58 minus 1 Vt, or Vpp, whichever is lower. Diode-connected N-channel device 30 is forward biased and will pass the current into node 60 independently of its voltage.

The effect of using two current sources driven by opposing clocks and the cross coupled devices 24 and 26 is that the current pumped by this current source acts more like a DC current than a pulsed current, which would be the case if only a single charge pump were used. This allows more efficient erasing of the EEPROM memory cells and provides other advantages.

Clamp device 32 operates to clamp the voltage produced by the current pump to a value which will assure that the EEPROM memory cells are not over erased. Over erasing of the memory cells will at best cause longer programming times for those cells and will, at worst, damage or destroy the memory devices. As a memory cell is erased, the voltage upon its drain rises. When the voltage on the drain of the memory cell rises to the point where the voltage on the source of clamp device 32 equals the voltage on its gate, minus 1 Vt, clamp device 32 will shut off, thus signaling the end of the erasing cycle and prevent overerasing. The voltage placed on the gate of clamp device 32 is selected to be a voltage equal to the voltage exhibited by a completely erased memory cell.

The use of the current pump of the present invention to erase EEPROM memory cells can be seen with respect to the FIGURE. After the pump current has passed from node 60 through clamp device 32 it is accessible by the Y-select devices. If the $Y_n$ select input is true and the $Y_{(n+1)}$ select input is false, Y-select device 38 is on and Y-select device 40 is off. The current which has flowed through clamping device 32 passes through N-channel Y-select device 38. If memory cell transistor 42 has been selected for erasing, its gate, word line WL1, will be placed at ground.

In order to erase the floating gate transistors used in the present invention, the source connection of that transistor should be left floating to avoid snapback. Therefore, during the erase mode source select device 54 is turned off by lowering the voltage on its gate.

Current flowing from the current source through clamping device 32 and Y-select device 38 flows into the drain of memory cell transistor 42 and starts to erase the device through its gate. Initially, there will be approximately nine volts at the drain of memory cell transistor 42. This voltage will "walk out" i.e., increase, until it reaches about 18 volts. This increase will be coupled through Y-select device 38 and will appear at the source of clamping device 32. At the point where the voltage at the source of clamping device 32 exceeds the clamp level, clamping device 32 will shut off and will cease supplying erase current.

While embodiments and applications of this invention have been shown and described, it will be apparent to those skilled in the art that many more modifications are possible without departing from the inventive concepts herein. The invention, therefore, is not to be restricted except in the spirit of the appended claims.

What is claimed is:

1. A memory circuit including a plurality of EEPROM transistors, each of said transistors including a source and a drain, and an erase circuit, said erase circuit including:

first and second constant current sources, means for alternately activating said first and second current sources, first current coupling means for coupling currents from said first and second constant current sources to first and second nodes, respectively, second current coupling means for combining said currents into an erasing current at a third node, means for selecting one of said EEPROM transistors to be erased, means for coupling said erasing current to the drain of said selected EEPROM transistor, means for sensing the voltage at the drain of said selected EEPROM transistor and for deactivating said means for coupling said erasing current when the voltage at the drain of said selected EEPROM transistor reaches a predetermined value.

2. The circuit of claim 1 wherein said first current coupling means are MOS gate capacitors.

3. The circuit of claim 1 wherein said sensing means is a voltage clamp connected MOS transistor.

4. The circuit of claim 1 wherein said second current coupling means are diode-connected MOS transistors.

5. The circuit of claim 1, further including means for floating the source of a selected EEPROM transistor to be erased.

6. The circuit of claim 5, wherein said means for floating includes a transistor device connected between the source of said selected EEPROM memory transistor and a voltage supply.

* * * * *